US008377628B2

(12) United States Patent
Meeus et al.

(10) Patent No.: US 8,377,628 B2
(45) Date of Patent: *Feb. 19, 2013

(54) NEGATIVE WORKING, HEAT-SENSITIVE, LITHOGRAPHIC PRINTING PLATE PRECURSOR

(75) Inventors: Pascal Meeus, Turnhout (BE); Joan Vermeersch, Deinze (BE)

(73) Assignee: Agfa Graphics NV, Mortsel (BE)

( * ) Notice: Subject to any disclaimer, the term of this patent is extended or adjusted under 35 U.S.C. 154(b) by 793 days.

This patent is subject to a terminal disclaimer.

(21) Appl. No.: 12/090,679

(22) PCT Filed: Apr. 4, 2006

(86) PCT No.: PCT/EP2006/061296

§ 371 (c)(1),
(2), (4) Date: Apr. 18, 2008

(87) PCT Pub. No.: WO2007/045515

PCT Pub. Date: Apr. 26, 2007

(65) Prior Publication Data

US 2008/0213696 A1 Sep. 4, 2008

Related U.S. Application Data

(60) Provisional application No. 60/736,094, filed on Nov. 10, 2005.

(30) Foreign Application Priority Data

Oct. 20, 2005 (EP) .................................... 05109781

(51) Int. Cl.
*G03F 7/09* (2006.01)
*G03F 7/26* (2006.01)
*B41N 1/08* (2006.01)

(52) U.S. Cl. .................. 430/275.1; 430/271.1; 430/300; 430/302; 101/453; 101/463.1

(58) Field of Classification Search ............... 430/270.1, 430/275.1, 300, 302, 271.1; 101/453, 463.1
See application file for complete search history.

(56) References Cited

U.S. PATENT DOCUMENTS

| | | | | |
|---|---|---|---|---|
| 4,369,246 | A * | 1/1983 | Chen et al. | 430/306 |
| 6,245,477 | B1 * | 6/2001 | Ray et al. | 430/138 |
| 6,511,782 | B1 * | 1/2003 | Vermeersch et al. | 430/270.1 |
| 6,701,843 | B2 * | 3/2004 | Verschueren et al. | 101/478 |
| 6,737,220 | B2 * | 5/2004 | Mori | 430/302 |
| 2002/0072013 | A1 * | 6/2002 | Vander Aa | 430/302 |
| 2005/0048398 | A1 * | 3/2005 | Yamasaki et al. | 430/270.1 |
| 2005/0084797 | A1 * | 4/2005 | Vermeersch et al. | 430/270.1 |
| 2006/0046189 | A1 * | 3/2006 | Kunita et al. | 430/270.1 |
| 2009/0155722 | A1 * | 6/2009 | Andriessen et al. | 430/302 |
| 2009/0258314 | A1 * | 10/2009 | Andriessen et al. | 430/270.1 |

FOREIGN PATENT DOCUMENTS

| | | | |
|---|---|---|---|
| EP | 1 106 381 | A1 | 6/2001 |
| EP | 1 145 848 | * | 10/2001 |
| EP | 1 155 820 | A2 | 11/2001 |
| EP | 1266750 | * | 12/2002 |
| EP | 1 342 568 | A1 | 9/2003 |
| EP | 1 356 926 | A | 10/2003 |
| EP | 1 500 498 | A2 | 1/2005 |
| JP | 2000-035663 | * | 2/2000 |
| WO | 03/010006 | A1 | 2/2003 |
| WO | 2004/066029 | A2 | 8/2004 |

OTHER PUBLICATIONS

Machine translation of JP 2000-035663, pulblished on Feb. 2, 2000.*
Official communication issued in the International Application No. PCT/EP2006/061296, mailed on Aug. 1, 2006.

* cited by examiner

*Primary Examiner* — Anca Eoff
(74) *Attorney, Agent, or Firm* — Keating & Bennett, LLP

(57) ABSTRACT

A heat-sensitive negative-working lithographic printing plate precursor includes on a grained and anodized aluminum support a coating including hydrophobic thermoplastic polymer particles, a hydrophilic binder, and an organic compound, wherein the organic compound includes at least one phosphonic acid group or at least one phosphoric acid group or a salt thereof.

16 Claims, No Drawings

NEGATIVE WORKING, HEAT-SENSITIVE, LITHOGRAPHIC PRINTING PLATE PRECURSOR

CROSS-REFERENCE TO RELATED APPLICATIONS

This application is a 371 of PCT/EP2006/061296, filed Apr. 4, 2006. This application claims the benefit of U.S. Provisional Application No. 60/736,094, filed Nov. 10, 2005, which is incorporated by reference herein in its entirety. In addition, this application claims the benefit of European Application No. 05109781.4, filed Oct. 20, 2005, which is also incorporated by reference herein in its entirety.

BACKGROUND OF THE INVENTION

1. Field of the Invention

The present invention relates to a heat-sensitive, negative working lithographic printing plate precursor.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called a plate precursor. In addition to the well known photosensitive, so-called pre-sensitized plates, which are suitable for UV contact exposure through a film mask, heat-sensitive printing plate precursors have also become very popular in the late 1990s. Such thermal materials offer the advantage of daylight stability and are especially used in the so-called computer-to-plate method wherein the plate precursor is directly exposed, i.e., without the use of a film mask. The material is exposed to heat or to infrared light and the generated heat triggers a (physico-)chemical process, such as ablation, polymerization, insolubilization by crosslinking of a polymer, heat-induced solubilization, or by particle coagulation of a thermoplastic polymer latex.

Although some of these thermal processes enable plate making without wet processing, the most popular thermal plates form an image by a heat-induced solubility difference in an alkaline developer between exposed and non-exposed areas of the coating. The coating typically includes an oleophilic binder, e.g., a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Negative working embodiments of such thermal materials often require a pre-heat step between exposure and development as described in, e.g., EP-A 625,728.

Negative working plate precursors which do not require a pre-heat step may contain an image-recording layer that works by heat-induced particle coalescence of a thermoplastic polymer latex, as described in, e.g., EP-A 770 494, EP-A 770 495, EP-A 770 496, and EP-A 770 497. These patents disclose a method for making a lithographic printing plate including the steps of (1) image-wise exposing a plate precursor having a heat-sensitive image-recording layer to infrared light, wherein the image-recording layer includes hydrophobic thermoplastic polymer particles, sometimes also referred to as latex particles, which are dispersed in a hydrophilic binder, and (2) developing the image-wise exposed element by applying water or by mounting the plate on the plate cylinder of a press and then supplying fountain solution and/or ink. During the development step, the unexposed areas of the image-recording layer are removed from the support, whereas the latex particles in the exposed areas have coalesced to form a hydrophobic phase which is not removed in the development step. In EP-A 1 342 568, a similar plate precursor is developed with a gum solution and in EP 1614538, EP 1614539, and EP 1614540, development is achieved by means of an alkaline solution.

EP 1 356 926 discloses a negative-working lithographic printing plate precursor including on a grained and anodized aluminum support having a surface roughness expressed as arithmetical mean center-line roughness Ra less than 0.45 mm, a heat-sensitive coating including hydrophobic thermoplastic polymer particles.

A lithographic printing plate precursor including on a hydrophilic support an image-forming layer containing a polymerizable compound, an initiator, and a compound containing a functional group having an interaction with the surface of the hydrophilic support is disclosed in EP 1 500 498.

EP 1 155 820 discloses a printing plate including on a support an undercoating layer, a first layer containing a polymer soluble in an alkaline aqueous solution, and a second layer containing a cyanine dye as an infrared absorbing agent and a cross-linking or polymeric compound which forms a covalent bond by action of light and/or heat and thereby lowers solubility of the second layer in an alkaline developing liquid.

EP 1 106 381 discloses a printing plate precursor including on a grained and anodized aluminum substrate having an average roughness Ra of 0.5 mm or less and/or micropores having a pore diameter of 1 to 5 nm and a pore density of $8\times10^{15}$ to $2\times10/m^2$, a photosensitive layer containing an infrared absorbing agent and a polymer soluble in an aqueous alkaline solution whose solubility in the solution varies by infrared laser exposure.

WO 2003/010006 and WO 2004/066029 disclose a printing plate precursor including on a hydrophilic lithographic base a coating including uncoalesced particles of a hydrophobic thermoplastic polymer and a non-crosslinkable aqueous-soluble composition which is capable of facilitating the removal of the unexposed portions of the coating in an aqueous developing solution. Examples of non-crosslinkable aqueous-soluble compositions include inorganic salts, organic bases, organic acids, and/or metal complexes.

A problem associated with plate precursors that work according to the mechanism of heat-induced latex coalescence is that after the coating step the surface of the printing plate precursor may show so-called point defects. These point defects may be visible throughout the surface of the coating and have varying dimensions; they are believed to be caused by local coagulation of latex particles. After exposure of such plate precursors, the image areas as well as the non-image areas may contain these point defects. During development, these spots are not always completely removed and may result in toning at the non-image areas (ink acceptance in the non-image areas). Especially, high sensitivity plates which include latex particles that are only weakly stabilized and thus coalesce readily, i.e., upon exposure at a low energy density, tend to show this problem of point defects.

SUMMARY OF THE INVENTION

In order to overcome the problems described above, preferred embodiments of the present invention provide a highly sensitive printing plate precursor that works by heat-induced coalescence of thermoplastic polymer particles and that is characterized by the occurrence of a minimum amount of point defects after the coating step.

The heat-sensitive negative-working lithographic printing plate precursor according to a preferred embodiment of the present invention preferably includes a printing plate precursor including on a grained and anodized aluminum support a coating including hydrophobic thermoplastic polymer particles, a hydrophilic binder, and an organic compound wherein the organic compound includes at least one phosphonic acid group or at least one phosphoric acid group or a salt thereof.

According to the various preferred embodiments of the present invention, it was discovered that the number and size of point defects present in the coating of a precursor including hydrophobic latex particles are greatly reduced when the coating includes an organic compound including at least one phosphonic acid group or at least one phosphoric acid group or a salt thereof.

In addition, it was discovered that a precursor including hydrophobic latex particles and an organic compound including at least one phosphonic acid group or at least one phosphoric acid group or a salt thereof also improves the shelf life of the precursor.

The organic compound is preferably represented by the following formula I:

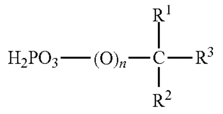

or a salt thereof and wherein:

n represents 0 or 1;

$R^1$ and $R^2$ independently represent hydrogen, an optionally substituted straight, branched, cyclic, or heterocyclic alkyl group having up to 8 carbon atoms, a halogen, a hydroxyl group, an optionally substituted aryl or heteroaryl group; and $R^3$ represents an optionally substituted straight, branched, cyclic, or heterocyclic alkyl group having up to 8 carbon atoms, a halogen, a hydroxyl group, an optionally substituted aryl or heteroaryl group, a carboxyl group, a phosphonic acid group, a phosphoric acid group, a sulphuric acid group, or a sulfonic acid group.

Other features, elements, steps, characteristics and advantages of the present invention will become more apparent from the following detailed description of preferred embodiments thereof.

DETAILED DESCRIPTION OF PREFERRED EMBODIMENTS

The coating of the printing plate precursor according to a preferred embodiment of the present invention includes hydrophobic thermoplastic particles. The coating may include one or more layer(s) and the layer including the hydrophobic thermoplastic particles is referred to herein as the "image-recording layer". The hydrophobic particles preferably have a number average particle diameter below 200 nm, more preferably between 10 nm and 100 nm. In a preferred embodiment, the average particle size is between 35 nm and 70 nm, more preferably between 40 nm and 65 nm. The particle size is defined herein as the particle diameter, measured by Photon Correlation Spectrometry, also known as Quasi-Elastic or Dynamic Light-Scattering. This technique produces values of the particle size that match well with the particle size measured with transmission electronic microscopy (TEM) as disclosed by Stanley D. Duke et al. in Calibration of Spherical Particles by Light Scattering, in Technical Note-002B, May 15, 2000 (revised Jan. 3, 2000 from a paper published in Particulate Science and Technology 7, pp. 223-228 (1989)).

The amount of hydrophobic thermoplastic polymer particles contained in the coating is preferably between 20 and 90 percent by weight (wt. %), relative to the weight of all the components in the coating. In a preferred embodiment, the amount of hydrophobic thermoplastic polymer particles present in the coating is at least 45 wt. % and more preferably at least 50 wt. %. An amount between 50 and 85 wt. % produces excellent results.

The hydrophobic thermoplastic polymer particles which are present in the coating are preferably selected from polyethylene, poly(vinyl)chloride, polymethyl(meth)acrylate, polyethyl (meth)acrylate, poyvinylidene chloride, poly (meth)acrylonitrile, polyvinylcarbazole, polystyrene or copolymers thereof. According to a preferred embodiment, the thermoplastic polymer particles include polystyrene or derivatives thereof, mixtures including polystyrene and poly (meth)acrylonitrile or derivatives thereof, or copolymers including polystyrene and poly(meth)acrylonitrile or derivatives thereof. The latter copolymers may include at least 50% by weight of polystyrene, and more preferably at least 65% by weight of polystyrene. In order to obtain sufficient resistivity towards organic chemicals such as hydrocarbons used in plate cleaners, the thermoplastic polymer particles preferably include at least 5% by weight of nitrogen containing units as described in EP 1,219,416, more preferably at least 30% by weight of nitrogen containing units, such as (meth)acrylonitrile. According to another preferred embodiment, the thermoplastic polymer particles consist essentially of styrene and acrylonitrile units in a weight ratio between 1:1 and 5:1 (styrene:acrylonitrile), e.g., in a 2:1 ratio.

The weight average molecular weight of the thermoplastic polymer particles may range from 5,000 to 1,000,000 g/mol.

The hydrophobic thermoplastic polymer particles can be prepared by addition polymerization or by condensation polymerization. They are preferably applied onto the lithographic base in the form of a dispersion in an aqueous coating liquid. These water based dispersions can be prepared by polymerization in a water-based system, e.g., by free-radical emulsion polymerization as described in U.S. Pat. No. 3,476,937 or EP 1,217,010 or by dispersing techniques of the water-insoluble polymers into water. Another method for preparing an aqueous dispersion of the thermoplastic polymer particles includes dissolving the hydrophobic thermoplastic polymer in an organic water immiscible solvent, and dispersing the thus obtained solution in water or in an aqueous medium and removing the organic solvent by evaporation.

Emulsion polymerization is typically carried out through controlled addition of several components, i.e., vinyl monomers, surfactants (dispersion aids), initiators, and optionally other components such as buffers or protective colloids, to a continuous medium, usually water. The resulting polymer of the emulsion polymerization is a dispersion of discrete particles in water. The surfactants or dispersion aids which are present in the reaction medium have multiple roles in the emulsion polymerization: (i) they reduce the interfacial tension between the monomers and the aqueous phase, (ii) they provide reaction sites through micelle formation in which the polymerization occurs, and (iii) they stabilize the growing polymer particles and ultimately the latex emulsion. The surfactants are absorbed at the water/polymer interface and thereby prevent coagulation of the fine polymer particles. Both non-ionic and anionic surfactants are preferably used in emulsion polymerization. Anionic surfactants are absorbed on the polymer particle and surround the particle with a charged double layer deriving from their anionic end groups and the positively charged counterions. This double layer on the surface of the polymer particles provides an energy barrier which stabilizes the emulsion or in other words which prevents coagulation of the particles. Emulsions stabilized with anionic surfactants are however sensitive to the presence of salts as salts will contract the double layer surrounding the latex particles resulting in a reduced latex stability. The hydrophobic thermoplastic particles used in a preferred embodiment of the present invention are preferably stabilized with an anionic dispersion aid. In the coating, the anionic dispersion aid may be present in its protonated form. The dispersion aid is preferably an organic compound including a sulphate, sulphonate, phosphate, or carboxylate group and may be represented by $R^a—SO_4^- X^+$, $R^b—SO_3^- X^+$, $R^c—PO_4H^- X^+$ or $R^d—COO^- X^+$ wherein $R^a$, $R^b$, $R^c$, and $R^d$ independently represent a straight or branched alkyl group having at least 10 carbon atoms, an aryl or heteroaryl group substituted with at least one straight or branched alkyl group having at least 10 carbon atoms, or a polyether group which includes at least one straight or branched alkyl group having at least 10 carbon such as an alkyl substituted polyalkylene-oxide group, and $X^+$ represents a cation such as $Na^+$ or $NH4^+$. The polyalkylene-oxide group may include a plurality of alkylene-oxide recurring units of the formula $—C_nH_{n2}—O—$ wherein n is preferably an integer in the range of 2 to 5. Preferred alkylene-oxide recurring units are typically ethylene oxide, propylene oxide or mixtures thereof. The number of the recurring units range preferably between 2 and 10 units, more preferably between 2 and 7 units, and preferably less than 100, more preferably less than 60.

In a preferred embodiment, the latex dispersion is stabilized with an organic compound including a carboxylate group.

Specific examples of suitable anionic dispersion aids include sodium lauryl sulphate, sodium lauryl ether sulphate, sodium dodecylbenzene sulphonate, sodium lauryl phosphate, and sodium lauryl ether ethylene oxide 6 carboxylate; suitable non-ionic dispersion aids are, for example, ethoxylated lauryl alcohol and ethoxylated octylphenol.

According to a preferred embodiment of the present invention, it was surpringly discovered that the addition of an organic compound including at least one phosphonic acid group or phosphoric acid group or a salt thereof to the coating, significantly reduces the size and number of point defects occurring on the surface of a coated grained and anodized aluminum support. Without being bound to any particular theory, it seems that $Al^{3+}$ ions which are typically present on the surface of a grained and anodized aluminum support destabilize the latex dispersion by, for example, contracting or reducing the charged double layer (see above) and cause local coagulation of latex particles which become visible as point defects. It was found that the presence of a compound which can interact with these $Al^{3+}$ ions seems to prevent this destabilization process and thus the coagulation of latex particles and thereby prevents the forming of point defects. Possible forms of interaction between the compound and these $Al^{3+}$ ions may be, for example, formation of ionic bonds, covalent-coordination bonds such as complex formation or other interactions.

Furthermore, it was surprisingly discovered that the shelf life of a precursor provided with a coating including an organic compound including at least one phosphonic acid group or phosphoric acid group or a salt thereof, is significantly improved.

The organic compound including a phosphonate group is present in the coating in an amount preferably ranging from 5 to 550 $mg/m^2$, preferably in an amount ranging from 8 to 250 $mg/m^2$, more preferably in an amount ranging from 10 to 160 $mg/m^2$.

In a preferred embodiment of the present invention, it was discovered that the sensitivity of a printing plate precursor including a coating including latex particles which are stabilized with a dispersion aid having a carboxylate group and the organic compound according to various preferred embodiments of the present invention is higher compared to a coating including another anionic dispersion aid or a non-ionic dispersion aid as described above.

In a preferred embodiment, the organic compound of the present invention is represented by the following formula I:

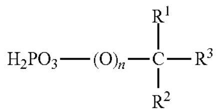

or a salt thereof and wherein:

n represents 0 or 1;

$R^1$ and $R^2$ independently represent hydrogen, an optionally substituted straight, branched, cyclic, or heterocyclic alkyl group having up to 8 carbon atoms, a halogen, a hydroxyl group, an optionally substituted aryl or heteroaryl group;

$R^3$ represents an optionally substituted straight, branched, cyclic, or heterocyclic alkyl group having up to 8 carbon atoms, a halogen, a hydroxyl group, an optionally substituted aryl or heteroaryl group, a carboxyl group, a phosphonic acid group, a phosphoric acid group, a sulphuric acid group, or a sulphonic acid group.

The optional substituents present on the straight, branched, cyclic, or heterocyclic alkyl group or on the aryl or heteroaryl group represent a halogen such as a chlorine or bromine atom, a hydroxyl group, an amino group, a (di)alkylamino group, an alkoxy group, a carboxyl group, a sulphonic acid group, a sulphuric acid group, phosphoric acid group, and a phosphonic acid group. The aryl or heteroaryl group may further include an alkyl group as an optional substituent.

In a more preferred embodiment, the organic compound compound is represented by formula II:

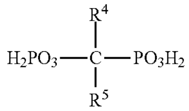

$R^4$ and $R^5$ independently represent hydrogen, an optionally substituted straight, branched, cyclic, or heterocyclic alkyl group having up to 8 carbon atoms, a halogen, a hydroxyl group, an optionally substituted aryl or heteroaryl group.

The optional substituents present on the straight, branched, cyclic, or heterocyclic alkyl group or on the aryl or heteroaryl group represent a halogen such as a chlorine or bromine atom, a hydroxyl group, an amino group, a (di)alkylamino group, an alkoxy group, a carboxyl group, a sulphonic acid group, a sulphuric acid group, a phosphoric acid group, and a phosphonic acid group. The aryl or heteroaryl group may further include an alkyl group as an optional substituent.

In an even more preferred embodiment, the organic compound is represented by formula III:

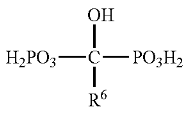

or a salt thereof and wherein:

$R^6$ independently represent hydrogen, an optionally substituted straight, branched, cyclic, or heterocyclic alkyl group or an optionally substituted aryl or heteroaryl group.

The optional substituents present on the straight, branched, cyclic, or heterocyclic alkyl group or on the aryl or heteroaryl group represent a halogen such as a chlorine or bromine atom, a hydroxyl group, an amino group, a (di)alkylamino group, an alkoxy group, a carboxyl group, a sulphonic acid group, a sulphuric acid group, phosphoric acid group, and a phosphonic acid group. The aryl or heteroaryl group may further include an alkyl group as an optional substituent.

A specific compound especially suitable to be used in a preferred embodiment of the present invention are the following compounds com-1 and com-2:

com-1

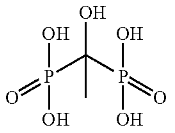

com-2

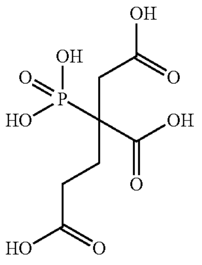

The image-recording layer further includes a hydrophilic binder which is preferably soluble in an aqueous developer having a pH ≧10. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate, and maleic anhydride/vinylmethylether copolymers.

The support of the lithographic printing plate precursor is preferably a grained and anodized aluminum support. The support may be a sheet-like material such as a plate or it may be a cylindrical element such as a sleeve which can be slid around a print cylinder of a printing press.

The aluminum is preferably grained by electrochemical graining, and anodized by anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained.

By anodizing the aluminum support, its abrasion resistance and hydrophilic nature are improved. The microstructure as well as the thickness of the $Al_2O_3$ layer are determined by the anodizing step, the anodic weight (g/$m^2$ $Al_2O_3$ formed on the aluminum surface) varies between 1 and 8 g/$m^2$.

The grained and anodized aluminum support may be post-treated to improve the hydrophilic properties of its surface. For example, the aluminum oxide surface may be silicated by treating its surface with a sodium silicate solution at elevated temperature, e.g., 95° C. Alternatively, a treatment may be applied which involves treating the aluminum oxide surface with a solution that may further contain an inorganic fluoride.

Further, the aluminum oxide surface may be rinsed with an organic acid and/or salt thereof, e.g., carboxylic acids, hydrocarboxylic acids, sulphonic acids or phosphonic acids, or their salts, e.g., succinates, phosphates, phosphonates, sulphates, and sulphonates. A citric acid or citrate solution is preferred. This treatment may be carried out at room temperature or may be carried out at a slightly elevated temperature of about 30° C. to about 50° C.

A further interesting treatment involves rinsing the aluminum oxide surface with a bicarbonate solution.

Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

In a particularly preferred embodiment, the grained and anodized lithographic support is post treated with a polymer containing acrylic acid monomeric units. The amount of acrylic acid monomeric units in the polymer is preferably at least 30 mol %, more preferably at least 50 mol %, even more preferably at least 75 mol %. Very good results in terms of point defects are obtained with a polymer consisting essentially of acrylic acid monomeric units. An example of a suitable polymer containing acrylic acid monomeric units is GLASCOL E15, polyacrylic acid commercially available from ALLIED COLLOID MANUFACTURING.

It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760, and U.S. Pat. No. 4,458,005.

An optimal ratio between pore diameter of the surface of the aluminum support and the average particle size of the hydrophobic thermoplastic particles may enhance the press life of the printing plate and may improve the toning behavior of the prints. This ratio of the average pore diameter of the surface of the aluminum support to the average particle size of the thermoplastic particles present in the image-recording layer of the coating, preferably ranges from 0.05:1 to 0.8:1, more preferably from 0.10:1 to 0.35:1.

The coating preferably also contains a compound which absorbs infrared light and converts the absorbed energy into heat. The amount of infrared absorbing agent in the coating is preferably between 0.25 and 25.0% by weight, more preferably between 0.5 and 20.0% by weight. In a preferred embodiment, its concentration is at least 6% by weight. The infrared absorbing compound can be present in the image-recording layer and/or an optional other layer. Preferred IR absorbing compounds are dyes such as cyanine, merocyanine, indoaniline, oxonol, pyrilium, and squarilium dyes or pigments such as carbon black. Examples of suitable IR absorbers are described in e.g., EP-A 823327, EP-A 978376, EP-A 1029667, EP-A 1053868, EP-A 1093934, WO 97/39894, and WO 00/29214. A preferred compound is the following cyanine dye IR-1 or a suitable salt thereof:

IR-1

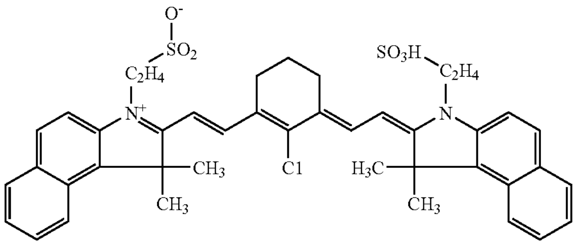

To protect the surface of the coating, in particular from mechanical damage, a protective layer may also optionally be applied. The protective layer generally includes at least one water-soluble polymeric binder, such as polyvinyl alcohol, polyvinylpyrrolidone, partially hydrolyzed polyvinyl acetates, gelatin, carbohydrates, or hydroxyethylcellulose, and can be produced in any known manner such as from an aqueous solution or dispersion which may, if required, contain small amounts, i.e., less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

The coating may, in addition to the image-recording layer, also contain one or more additional layer(s). Besides the additional layers already discussed above, i.e., an optional light-absorbing layer including one or more compounds that are capable of converting infrared light into heat and/or a protective layer such as, e.g., a covering layer which is removed during processing, the coating may further include, for example, an adhesion-improving layer between the image-recording layer and the support.

Optionally, the coating may further contain additional ingredients. These ingredients may be present in the image-recording layer or in an optional other layer. For example, additional binders, polymer particles such as matting agents and spacers, surfactants such as perfluoro surfactants, silicon or titanium dioxide particles, development inhibitors, development accelerators, or colorants are well-known components of lithographic coatings. Especially, addition of colorants such as dyes or pigments which provide a visible color to the coating and remain in the exposed areas of the coating after the processing step, are advantageous. Thus, the image-areas which are not removed during the processing step form a visible image on the printing plate and examination of the developed printing plate already at this stage becomes feasible. Typical examples of such contrast dyes are the amino-substituted tri- or diarylmethane dyes, e.g., crystal violet, methyl violet, victoria pure blue, flexoblau 630, basonylblau 640, auramine, and malachite green. Also the dyes which are discussed in depth in the detailed description of EP-A 400,706 are suitable contrast dyes. Dyes which, combined with specific additives, only slightly color the coating but which become intensively colored after exposure, are also of interest.

The printing plate precursor according to a preferred embodiment of the present invention can be image-wise exposed directly with heat, e.g., by a thermal head, or indirectly by infrared light, preferably near infrared light. The infrared light is preferably converted into heat by an IR light absorbing compound as discussed above. The heat-sensitive lithographic printing plate precursor of a preferred embodiment of the present invention is preferably not sensitive to visible light. Most preferably, the coating is not sensitive to ambient daylight, i.e., visible (400-750 nm) and near UV light (300-400 nm) at an intensity and exposure time corresponding to normal working conditions so that the material can be handled without the need for a safe light environment.

The printing plate precursors of the various preferred embodiments of the present invention can be exposed to infrared light by e.g., LEDs or an infrared laser. Preferably, the light used for the exposure is a laser emitting near infrared light having a wavelength in the range from about 700 to about 1500 nm, e.g., a semiconductor laser diode, a Nd:YAG, or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e., the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Graphics NV) is a typical example of a plate-setter using the ITD-technology. XTD plate-setters for thermal plates having a typical laser power from about 20 mW to about 500 mW operate at a lower scan speed, e.g., from 0.1 to 20 m/sec. The Creo Trendsetter plate-setter family (trademark of Creo) and the Agfa Xcalibur plate-setter family (trademark of Agfa Graphics NV) both make use of the XTD-technology.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening, or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

After exposure, the precursor can be developed by a suitable processing liquid. In the development step, the non-exposed areas of the image-recording layer are removed without essentially removing the exposed areas, i.e., without affecting the exposed areas to an extent that renders the ink-acceptance of the exposed areas unacceptable. The processing liquid can be applied to the plate, e.g., by rubbing in with an impregnated pad, by dipping, (spin-)coating, spraying, pouring-on, either by hand or in an automatic processing apparatus. The treatment with a processing liquid may be combined with mechanical rubbing, e.g., by a rotating brush. The developed plate precursor can, if required, be post-treated with rinse water, a suitable correcting agent, or preservative as known in the art. During the development step, any water-soluble protective layer present is preferably also removed.

Alternatively, the printing plate precursor can, after exposure, be mounted on a printing press and be developed on-press by supplying ink and/or fountain solution to the precursor.

Suitable processing liquids are plain water or aqueous solutions, e.g., a gumming solution or an alkaline solution. The gum solution which can be used in the development step, is typically an aqueous liquid which includes one or more surface protective compounds that are capable of protecting the lithographic image of a printing plate against contamination or damage. Suitable examples of such compounds are film-forming hydrophilic polymers or surfactants. The gum solution preferably has a pH from 4 to 10, more preferably from 5 to 8. Preferred gum solutions are described in EP 1,342,568.

The preferred embodiment using an alkaline solution is now described in more detail. A preferred developer solution is a developer with a pH of at least 10, more preferably at least 11, even more preferably at least 12. Preferred developer solutions are buffer solutions such as, for example, silicate-based developers or developer solutions including buffers. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution including sodium or potassium metasilicate, i.e., a silicate where the ratio of silicon dioxide to alkali metal oxide is 1.

In addition to alkali metal silicates, the developer may optionally contain further components, such as buffer substances, complexing agents, antifoams, organic solvents in small amounts, corrosion inhibitors, dyes, surfactants, and/or hydrotropic agents as known in the art.

The development is preferably carried out at temperatures of from 20° C. to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of plate precursor. The addition of replenisher can be regulated, for example, by measuring the conductivity of the developer as described in EP-A 0,556,690.

The development step may be followed by a rinsing step and/or a gumming step. The gumming step involves post-treatment of the lithographic printing plate with a gum solution. A gum solution is typically an aqueous liquid which includes one or more surface protective compounds that are capable of protecting the lithographic image of a printing plate against contamination or damage. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the thermoplastic particles, e.g., between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes, or at a temperature of 120° C. for 30 minutes. Baking can be done in conventional hot air ovens or by irradiation with lamps emitting in the infrared or ultraviolet spectrum. As a result of this baking step, the resistance of the printing plate to plate cleaners, correction agents, and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517; and U.S. Pat. No. 6,140,392. In another preferred embodiment, the single-fluid ink includes an ink phase, also called the hydrophobic or oleophilic phase, and a polyol phase as described in WO 00/32705.

EXAMPLES

Example 1

1) Preparation of the Lithographic Support

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained for 15 seconds using an alternating current in an aqueous solution containing 12 g/l of hydrochloric acid and 38 g/l of aluminum sulfate (18-hydrate) at a temperature of 33° C. and a current density of 130 $A/dm^2$. After rinsing with demineralized water for 2 seconds, the aluminum foil was then desmutted by etching with an aqueous solution containing 155 g/l of sulfuric acid at 70° C. for 4 seconds and rinsed with demineralized water at 25° C. for 2 seconds. The foil was subsequently subjected to anodic oxidation for 13 seconds in an aqueous solution containing 155 g/l of sulfuric acid at a temperature of 45° C. and a current density of 22 $A/dm^2$, then washed with demineralized water for 2 seconds and post-treated for 10 seconds with a solution containing 4 g/l of polyvinylphosphonic acid at 40° C., rinsed with demineralized water at 20° C. for 2 seconds and dried. The support thus obtained has a surface roughness Ra of 0.21 μm and an anodic weight of 4 $g/m^2$ of $Al_2O_3$.

2) Preparation of the Printing Plate Precursors

The printing plate precursors PPP-1 to PPP-5 were produced by applying a coating onto the above described lithographic support. The coating was applied from an aqueous coating solution, dried and the layer thus obtained had a composition as defined in Table 1. Before coating, the pH of the coating solution was adjusted to 3.55.

TABLE 1

| Composition of the Dry Coating(mg/$m^2$) | | | | | |
|---|---|---|---|---|---|
| INGREDIENTS mg/$m^2$ | PPP-1 Comp. | PPP-2 Comp. | PPP-3 Comp. | PPP-4 Inv. | PPP-5 Inv. |
| Styrene/acrylonitrile copolymer (1) | 557.2 | 557.2 | 557.2 | 557.2 | 557.2 |
| Cab O Jet 250 (2) | 20.1 | 20.1 | 20.1 | 20.1 | 20.1 |
| Triethylammonium salt of IR-1 (3) | 53.7 | 53.7 | 53.7 | 53.7 | 53.7 |
| Polyacrylic acid binder (4) | 40.3 | 40.3 | 40.3 | 40.3 | 40.3 |
| Zonyl FSO 100 (5) | 6.8 | 6.8 | 6.8 | 6.8 | 6.8 |
| Citric acid | — | 15 | 75 | — | — |
| Dequest 2010 (6) | — | — | — | 15 | 75 |

(1) weight ratio 60/40, stabilized with an anionic wetting agent; average particle size of 50 nm, measured with a PL-PSDA Particle Size Distribution Analyzer, commercially available from Polymer Laboratories;
(2) Pigment available from Cabot Corporation, added as 5% aqueous dispersion (modified Cu-phtalacyanine);
(3) Infrared absorbing dye IR-1 as defined above;
(4) Aquatreat AR-7H from National Starch & chemical company, Mw = 500 000 g/mol;
(5) Surfactant commercially available from Dupont;
(6) 1-hydroxyethylidene-1,1-diphosphonic acid, 60% in water commercially available from from Solutia.

3) Evaluation of the Printing Plate Precursors

The printing plate precursors PPP-1 to PPP-5 were inspected for point defects by visual evaluation. The inspection procedure was the following:

(i) four independent visual evaluations for determining point defects were carried out on each printing plate precursor;

(ii) the number of point defects as well as the size of the point defects were evaluated. PPP-1 was used as a reference and the number and size of point defects present on PPP-1 was set to 100.

The point defects were measured according to the above procedure on two levels:

level I: a point defect visible with the eye;

level II: a point defect only visible upon 8× magnification.

The results of the measurements are summarized in Table 2.

TABLE 2

| Number and Size of Point Defects | | | | |
|---|---|---|---|---|
| | Level I | | Level II | |
| Printing plate precursor | Number | Size | Number | Size |
| PPP-1 (reference) | 100 | 100 | 100 | 100 |
| PPP-2 (comparative) | 100 | 100 | 100 | 100 |
| PPP-3 (Comparative) | 100 | 100 | 100 | 100 |
| PPP-4 (invention) | 5 | 100 | 30 | 50 |
| PPP-5 (invention) | 5 | 100 | 20 | 40 |

The results of Table 2 show that the presence of citric acid in the coating (comparative precursors PPP-2 and PPP-3) does not influence the number or size of the point defects. The inventive printing plate precursors PPP-4 and PPP-5 including the organic compound according to the various preferred embodiments of the present invention has a significant effect on the number and size of the point defects: the number and/or size are drastically reduced.

4) Lithographic Behavior

The lithographic behavior of the printing plate precursors PPP-1 to PPP-5 and the related printing plates in terms of speed, shelf life, and run length were the same for all plates. There is no influence on the lithographic behavior upon the addition of citric acid (PPP-2 and PPP-3) or the organic compound of the various preferred embodiments of the present invention (PPP-4 and PPP-5) compared to the reference PPP-1.

Example 2

1) Preparation of the Lithographic Support

The support was prepared as in Example 1.

2) Preparation of the Printing Plate Precursor

The printing plate precursors PPP-6 to PPP-10 were produced by applying a coating onto the above described lithographic support. The coating was applied from an aqueous coating solution, dried and the layer thus obtained had a composition as defined in Table 3. Before coating, the pH of the coating solution was adjusted to 3.5.

TABLE 3

| Composition of the Dry Coating(mg/$m^2$). | | | | | |
|---|---|---|---|---|---|
| INGREDIENTS mg/$m^2$ | PPP-6 Ref. | PPP-7 Inv. | PPP-8 Inv. | PPP-9 Inv. | PPP-10 Inv. |
| Styrene/Acrylonitrile copolymer (1) | 646.8 | 646.8 | 646.8 | 646.8 | 646.8 |
| Cab O Jet 250 (2) | 42.0 | 42.0 | 42.0 | 42.0 | 42.0 |
| Triethylammonium salt of IR-1 (3) | 84.0 | 84.0 | 84.0 | 84.0 | 84.0 |
| Polyacrylic acid binder (4) | 84.0 | 84.0 | 84.0 | 84.0 | 84.0 |
| Zonyl FSO 100 (5) | 7.5 | 7.5 | 7.5 | 7.5 | 7.5 |
| Dequest 2010 (6) | — | 15.1 | 30.2 | 45.4 | 60.5 |

(1) weight ratio 60/40, stabilized with an anionic wetting agent; average particle size of 50 nm, measured with a PL-PSDA Particle Size Distribution Analyzer, commercially available from Polymer Laboratories;
(2) Pigment available from Cabot Corporation, added as 5% aqueous dispersion (modified Cu-phtalacyanine);
(3) Infrared absorbing dye IR-1 as defined above;
(4) 5% wt solution of Glascol E15 commercially available from Ciba Speciality Chemicals, Mw = 500 000 g/mol;
(5) Surfactant commercially available from Dupont;
(6) 1-hydroxyethylidene-1,1-diphosphonic acid, 60% in water commercially available from from Solutia.

The plate precursors 6-10 were exposed with a Creo Trendsetter 2344T (40W) (plate-setter, trademark from Creo, Burnaby, Canada), operating at 150 rpm and at an energy density of 275 mJ/$cm^2$.

3) Shelf Life Results

After exposure, the plate precursors were processed in an Agfa Clean Out Unit 80 (trademark from Agfa Graphics NV), operating at a speed of 1.1 m/min and at 22° C., using Agfa RC520 as developer solution (trademark from Agfa Graphics NV). Dmin values were measured on the non-image areas of the obtained printing plates and are summarized in Table 4. Then, the printing plates were aged in an oven for 7 days at 35° C. and a RH value of 80%. After the aging test, the printing plates were processed (see above) and again Dmin was measured at the non-image areas. The difference between the Dmin values before and after the ageing test Δ(Dmin) is a measure of shelf life; the smaller the difference, the better the shelf life. The results show that Δ(Dmin) is for the inventive printing plates 7-10 much smaller compared to the reference printing plate 6 indicating an improved shelf life for the plates including the organic compound of the various preferred embodiments of the present invention.

Dmin is measured with a Gretag Macbeth densitometer Type D19C (available from Gretag Macbeth AG).

TABLE 4

| Shelf Life Results | | | |
|---|---|---|---|
| Printing plate | Dmin before ageing | Dmin after ageing | Δ(Dmin) Shelf life* |
| PP-6 (reference) | 0.151 | 0.582 | 0.431 |
| PP-7 (invention) | 0.158 | 0.385 | 0.227 |
| PP-8 (invention) | 0.127 | 0.336 | 0.209 |
| PP-9 (invention) | 0.114 | 0.271 | 0.157 |
| PP-10 (invention) | 0.07 | 0.266 | 0.196 |

*Δ(Dmin) is a measure of shelf life: the lower the value the better the shelf life.

Example 3

1) Preparation of the Lithographic Support

The support was prepared as in Example 1.

2) Preparation of the Printing Plate Precursors

The printing plate precursors PPP-11 to PPP-14 were produced by applying a coating onto the above described lithographic support. The coating was applied from an aqueous coating solution, dried and the layer thus obtained had a composition as defined in Table 5. Before coating, the pH of the coating solution was adjusted to 3.6.

TABLE 5

| Composition of the Dry Coating($mg/m^2$). | | | | |
|---|---|---|---|---|
| INGREDIENTS $mg/m^2$ | PPP-11 Ref. | PPP-12 Inv. | PPP-13 Inv. | PPP-14 Inv. |
| Styrene/Acrylonitrile copolymer (1) | 648.6 | — | 648.6 | — |
| Styrene/Acrylonitrile copolymer (2) | — | 648.6 | — | 648.6 |
| Heliogen Blau D7490 (3) | 75.6 | 75.6 | 75.6 | 75.6 |
| Triethylammonium salt of IR-1 (4) | 84.0 | 84.0 | 84.0 | 84.0 |
| Polyacrylic acid binder (5) | 84.0 | 84.0 | 84.0 | 84.0 |
| Zonyl FSO 100 (6) | 7.5 | 7.5 | 7.5 | 7.5 |
| Dequest 2010 (7) | 151.2 | 151.2 | 419.4 | 419.4 |

(1) weight ratio 50/50, stabilized with sodium dodecyl sulphonate; average particle size of 49 nm, measured with a Brookhaven BI-90 analyzer, commercially available from Brookhaven Instrument Company, Holtsville, NY;
(2) weight ratio 50/50, stabilized with 3% Akypo RLM45 from Kao Chemicals GmbH, particle size 43 nm, measured with a Brookhaven BI-90 analyzer, commercially available from Brookhaven Instrument Company, Holtsville, NY, USA; Akypo RLM45
(3) Contrast dye from BASF, added as a 20% aqueous dispersion (modified Cu-free phtalocyanine dye);
(4) Infrared absorbing dye IR-1 as defined above;
(5) 5% wt solution of Glascol E15 commercially available from Ciba Speciality Chemicals, Mw = 500 000 g/mol;
(6) Perfluoro surfactant commercially available from Dupont;
(7) 1-hydroxyethylidene-1,1-diphosphonic acid, 60% in water commercially available from from Solutia.

The plate precursors 11-14 were exposed with a Creo Trendsetter 2344T (40W) (plate-setter, trademark from Creo, Burnaby, Canada), operating at 170 rpm and at a varying energy density ranging from 180 $mJ/cm^2$ to 260 $mJ/cm^2$.

3) Preparation of the Printing Plates

After exposure, the plate precursors were processed in an Agfa Clean Out Unit 80 (trademark from Agfa Graphics NV), operating at a speed of 1.1 m/min and at 22° C., using Agfa RC527 as developer solution (trademark from Agfa Graphics NV). Dmin values were measured on the non-image areas of the obtained printing plates and are summarized in Table 6.

Subsequently the printing plates were mounted on a GT046 printing press (available from Heidelberger Druckmaschinen AG) and a print job up to 1,000 impressions was performed using K+E Novavit 800 Skinnex ink (available from BASF Drucksystem GmbH) and 3% Agfa FS101 (trademark from Agfa)+10% isopropanolamine as a fountain solution.

TABLE 6

| Sensitivity Results and Clean Out Behavior | | | |
|---|---|---|---|
| | | Clean-out Performance | |
| Printing plates | Sensitivity $mJ/cm^2$ (1) | Dmin (2) | Visual evaluation of the printed sheet (3) |
| PPP-11 Comparative | 260 | 0.15 | OK |
| PPP-12 Inventive | 230 | 0.19 | OK |
| PPP-13 Comparative | 270 | 0.11 | OK |
| PPP-14 Inventive | 190 | 0.17 | OK |

(1) Sensitivity is defined as the energy density at which the 2% dots @ 200 lpi can be reproduced in a stable and consistent way on the printed sheet.
(2) Dmin is measured with a densitometer Gretag D19C using a cyan filter.
(3) Visual assessment of toning on the printed sheet as well as ink build-up on the blanket.

The results in Table 6 show that latex particles stabilized with a carboxylate dispersion aid improve the sensitivity of the printing plate without significantly reducing its clean-out performance.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A heat-sensitive lithographic printing plate precursor based on heat-induced latex coalescence comprising:

a grained and anodized aluminum support; and a heat-sensitive coating arranged on the support, the heat-sensitive coating including heat-induced coalescing hydrophobic thermoplastic polymer particles, a hydrophilic binder, and an organic compound including at least one phosphonic acid group or at least one phosphoric acid group or a salt thereof; wherein the organic compound is represented by the following formula:

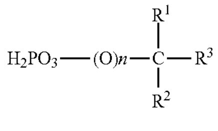

or a salt thereof; and wherein:

n represents 0 or 1;

$R^1$ and $R^2$ independently represent hydrogen, a straight, branched, cyclic, or heterocyclic alkyl group having up to 8 carbon atoms, a halogen, a hydroxyl group, or an aryl or heteroaryl group; and $R^3$ represents a straight, branched, cyclic, or heterocyclic alkyl group having up to 8 carbon atoms, a halogen, a hydroxyl group, an aryl or heteroaryl group, a carboxyl group, a phosphonic acid group, a phosphoric acid group, a sulphuric acid group, or a sulfonic acid group.

2. The printing plate precursor according to claim 1, wherein the hydrophobic thermoplastic particles are stabilized with an anionic dispersion aid.

3. The printing plate precursor according to claim 2, wherein the anionic dispersion aid is an organic compound including a carboxylate group.

4. The printing plate precursor according to claim 1, wherein n is 0.

5. The printing plate precursor according to claim 1, wherein the organic compound is present in the heat-sensitive coating in an amount ranging from 10 $mg/m^2$ to 160 $mg/m^2$.

6. The printing plate precursor according to claim 1, wherein the hydrophobic thermoplastic polymer particles have an average particle size in the range from 40 nm to 70 nm.

7. The printing plate precursor according to claim 1, wherein the amount of the hydrophobic thermoplastic polymer particles in the heat-sensitive coating is at least 70% by weight.

8. The printing plate precursor according to claim 1, wherein the hydrophobic thermoplastic polymer particles include at least 5% by weight of nitrogen containing units.

9. A method for making a heat-sensitive lithographic printing plate precursor comprising the step of:

providing the grained and anodized aluminum support and the heat-sensitive coating including the hydrophobic thermoplastic polymer particles, hydrophilic binder, and organic compound as defined in claim 1; and coating the heat-sensitive coating onto the support.

10. A method according to claim 9, wherein the hydrophobic thermoplastic polymer particles have an average particle size in the range from 40 nm to 70 nm.

11. A method according to claim 9, wherein the amount of the hydrophobic thermoplastic polymer particles in the heat-sensitive coating is at least 70% by weight.

12. A method according to claim 9, wherein the hydrophobic thermoplastic polymer particles include at least 5% by weight of nitrogen containing units.

13. A method for making a heat-sensitive lithographic printing plate comprising the steps of:

providing the printing plate precursor according to claim 1;

exposing the printing plate precursor to heat to coalesce the hydrophobic thermoplastic polymer particles; and developing the exposed precursor by removing unexposed areas in a processing liquid.

14. A method for making a heat-sensitive lithographic printing plate comprising the steps of:

providing the printing plate precursor according to claim 1;

exposing the printing plate precursor to heat to coalesce the hydrophobic thermoplastic polymer particles; and mounting the precursor on a printing press and developing it by supplying ink and/or fountain solution to the precursor.

15. A heat-sensitive lithographic printing plate precursor based on heat-induced latex coalescence comprising:

a grained and anodized aluminum support; and a heat-sensitive coating arranged on the support, the heat-sensitive coating including heat-induced coalescing hydrophobic thermoplastic polymer particles, a hydrophilic binder, and an organic compound including at least one phosphonic acid group or at least one phosphoric acid group or a salt thereof; wherein the organic compound is represented by the following formula:

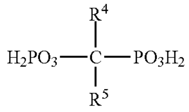

or a salt thereof; and wherein:

$R^4$ and $R^5$ independently represent hydrogen, an optionally substituted straight, branched, cyclic, or heterocyclic alkyl group having up to 8 carbon atoms, a halogen, a hydroxyl group, or an optionally substituted aryl or heteroaryl group.

16. A heat-sensitive lithographic printing plate precursor based on heat-induced latex coalescence comprising:

a grained and anodized aluminum support; and a heat-sensitive coating arranged on the support, the heat-sensitive coating including heat-induced coalescing hydrophobic thermoplastic polymer particles, a hydrophilic binder, and an organic compound including at least one phosphonic acid group or at least one phosphoric acid group or a salt thereof; wherein the organic compound is represented by the following formula:

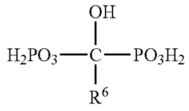

or a salt thereof; and wherein:

$R^6$ independently represents hydrogen, an optionally substituted straight, branched, cyclic, or heterocyclic alkyl group having up to 8 carbon atoms, or an optionally substituted aryl or heteroaryl group.

* * * * *